US009056262B2

(12) United States Patent
Seiwert et al.

(10) Patent No.: US 9,056,262 B2
(45) Date of Patent: Jun. 16, 2015

(54) PRESSURE-LESS OZONATED DI-WATER (DIO₃) RECIRCULATION RECLAIM SYSTEM

(71) Applicant: MKS Instruments, Inc., Andover, MA (US)

(72) Inventors: Johannes Heinrich Seiwert, Berlin (DE); Ulrich Alfred Brammer, Berlin (DE); Martin Blacha, Berlin (DE); Gerhard Joachim Schnaiter, Blankenfelde (DE)

(73) Assignee: MKS Instruments, Inc., Andover, MA (US)

( * ) Notice: Subject to any disclaimer, the term of this patent is extended or adjusted under 35 U.S.C. 154(b) by 186 days.

(21) Appl. No.: 13/836,842

(22) Filed: Mar. 15, 2013

(65) Prior Publication Data

US 2014/0124036 A1 May 8, 2014

Related U.S. Application Data

(60) Provisional application No. 61/724,006, filed on Nov. 8, 2012.

(51) Int. Cl.
| | | |
|---|---|---|
| B01D 19/00 | (2006.01) | |
| C02F 1/20 | (2006.01) | |
| G03F 7/42 | (2006.01) | |
| C02F 1/78 | (2006.01) | |
| C02F 103/34 | (2006.01) | |

(52) U.S. Cl.
CPC . *B01D 19/00* (2013.01); *C02F 1/20* (2013.01); *C02F 1/78* (2013.01); *G03F 7/423* (2013.01); *C02F 2103/346* (2013.01)

(58) Field of Classification Search
None
See application file for complete search history.

(56) References Cited

U.S. PATENT DOCUMENTS

| | | | | |
|---|---|---|---|---|
| 5,264,025 A | * | 11/1993 | Asai et al. | 95/263 |
| 6,786,976 B1 | | 9/2004 | Gottschalk et al. | |
| 2003/0134518 A1 | | 7/2003 | Novak et al. | |
| 2003/0164338 A1 | * | 9/2003 | Fittkau et al. | 210/760 |
| 2004/0154641 A1 | | 8/2004 | Montierth | |
| 2005/0133067 A1 | | 6/2005 | Bergman | |
| 2008/0257738 A1 | * | 10/2008 | Seiwert et al. | 204/549 |
| 2012/0279396 A1 | * | 11/2012 | Brammer et al. | 95/263 |
| 2013/0233357 A1 | | 9/2013 | Minamihonoki et al. | |

FOREIGN PATENT DOCUMENTS

| | | |
|---|---|---|
| JP | H10107003 | 4/1998 |
| JP | 2007326101 | 12/2007 |
| WO | 2012125820 | 9/2012 |

* cited by examiner

*Primary Examiner* — Duane Smith
*Assistant Examiner* — Phillip Shao
(74) *Attorney, Agent, or Firm* — Proskauer Rose LLP (57) ABSTRACT

The invention provides, in one aspect, a system for recirculating ozonated liquid. The system includes a contactor including at least two inlets and at least two outlets. The contactor is in fluid communication with a first liquid source at a first contactor inlet and a second liquid source at a second contactor inlet, and the second contactor inlet receives gas that purges at least a portion of gas from liquid received at the first contactor inlet. The purged gas exits the contactor at a first contactor outlet. The contactor is in fluid communication with the second liquid source at a second contactor outlet, and the contactor drains at least a portion of the liquid in the contactor, the drained liquid exiting the contactor at the second contactor outlet. The contactor includes a third inlet in fluid communication with the first liquid source, the third inlet allowing the first liquid source to release liquid at an ambient pressure.

23 Claims, 4 Drawing Sheets

Figure 2A
(recirculation process)

Figure 2B
(degassing process)

PRESSURE-LESS OZONATED DI-WATER ($DIO_3$) RECIRCULATION RECLAIM SYSTEM

CROSS REFERENCE TO RELATED APPLICATION

This application claims the benefit of and priority to U.S. Provisional Patent Application No. 61/724,006, filed Nov. 8, 2012, which is owned by the assignee of the instant application and the entire disclosure of which is incorporated herein by reference.

FIELD OF THE INVENTION

In general, the invention relates to devices, systems and methods employed in wet cleaning semiconductor devices. In particular, the invention relates to a system that can purge can recirculate liquids and can purge unwanted gas from the liquid to be recirculated.

BACKGROUND OF THE INVENTION

Microelectronics chips such as integrated circuits are made from comparatively large wafers of semiconductor material. This process typically involves multiple successive steps including the following: generation of an etch mask photolithographically; etching of a layer of material as defined by the mask; removal of the photolithographic mask through some combination of wet and dry chemical techniques; removal of oxide layers prior to further processing; deposition of layers of materials; and/or rinsing to remove residual chemistry. The photolithographic mask can be formed from a polymeric material called a photoresist. After the photoresist mask has been removed, a final cleaning step, called rinsing and/or wet cleaning is typically performed. In some systems, cleaning steps are also applied between other processing steps.

Ozonated deionized water ($DIO_3$-water) is known for its use in the semiconductor industry for, for example, wet cleaning processes and/or etching of tungsten layers. However, $DIO_3$ is not a stable fluid. For example, the ozone can decay with a half-life time of approximately twelve minutes (depending upon temperature, water chemistry, etc.). Current systems typically address this problem by operating a constant flow of $DIO_3$ that is both expensive and wasteful.

SUMMARY OF THE INVENTION

One advantage of the invention is that the cost associated with operating a fluid delivery system (e.g., for wet wafer processing) is reduced. Another advantage of the invention is that it can use a particle free pump (e.g., a centrifugal pump). Another advantage of the invention is that it can supply a continuous flow of $DIO_3$ that is less wasteful than current systems. Another advantage of the invention is that off-gas from the fluid delivery system can be a second time. Another advantage of the invention is that one compact vessel can be used.

In one aspect, the invention provides a system for recirculating ozonated liquid. The system includes a contactor including at least two inlets and at least two outlets. The contactor is in fluid communication with a first liquid source at a first contactor inlet and a second liquid source at a second contactor inlet, and the second contactor inlet receives gas that purges at least a portion of gas from liquid received at the first contactor inlet. The purged gas exits the contactor at a first contactor outlet. The contactor is in fluid communication with the second liquid source at a second contactor outlet, and the contactor drains at least a portion of the liquid in the contactor, the drained liquid exiting the contactor at the second contactor outlet. The contactor includes a third inlet in fluid communication with the first liquid source, the third inlet allowing the first liquid source to release liquid at an ambient pressure.

In some embodiments, at least a portion of the liquid received at the first contactor inlet comprises at least a portion of the liquid drained from the contactor via the second contactor outlet.

In some embodiments, the contactor includes a fourth inlet in fluid communication with a third a liquid source, the fourth inlet receiving fresh liquid from the third liquid source that replaces at least a portion of the liquid drained from the contactor.

In some embodiments, the contactor includes any of a packed column, plate column, or bubble column.

In some embodiments, the system includes a first pump in fluid communication with the contactor via a) at least one inlet of the first pump being in fluid communication with the second outlet of the contactor, and b) an outlet of the first pump being in fluid communication with the second liquid source.

In some embodiments, the outlet of the first pump is in fluid communication with the contactor via a fourth inlet of the contactor.

In some embodiments, the first pump includes a centrifugal pump.

In some embodiments, the system includes a destruct component that includes at least an inlet, the inlet of the destruct component in fluid communication with the first contactor outlet. In some embodiments, the inlet of the destruct component receives at least a portion of the gas purged by the contactor.

In some embodiments, the gas received at the first inlet of the destruct component is heated or diluted with Clean Dry Air (CDA) or other inert gas.

In some embodiments, an outlet of the destruct component exhausts at least a portion of the purged gas received at the inlet of the destruct component.

In some embodiments, the gas flow at the outlet of the destruct component is measured and the information is used for system control.

In some embodiments, the destruct component uses a catalyst to convert the received gas into oxygen and exhausts the oxygen via the outlet of the destruct component. In some embodiments, the catalyst comprises any of (i) manganese-oxide based product or (ii) a carbon-based product.

In some embodiments, any of the liquid (i) received at the first inlet of the contactor or (ii) drained from the second outlet of the contactor, comprises ozonated deionized water ($DIO_3$).

In some embodiments, the gas received at the first inlet of the contactor comprises (i) $O_3$, (ii) $O_2$, (iii) $CO_2$, (iv) $N_2$, (iv) Clean Dry Air (CDA), (v) inert gas, (vi) doping gas, (vii) off-gas, (viii) off-gas from the second liquid source, or any combination thereof.

In some embodiments, the portion of gas purged from the liquid comprises (i) $O_3$, (ii) $O_2$ (iii) $CO_2$, or any combination thereof. In some embodiments, the gas received at the first inlet of the contactor is the off-gas from the second liquid source.

In some embodiments, the first liquid source includes a tool used in a semiconductor manufacturing process.

In some embodiments, a temperature of the liquid is measured and a temperature of the liquid is controlled via a heat exchanger or by liquid discarding.

In some embodiments, the second liquid source includes a $DIO_3$ water delivery system.

In another aspect, the invention includes a system for recirculating ozonated liquid. The system includes a first contactor including at least four inlets and at least two outlets, wherein the first contactor is in fluid communication with a first liquid source at a first inlet of the first contactor, the second inlet of the first contactor receiving gas that purges a first portion of gas from liquid received at the first inlet of the first contactor, the purged gas exiting the first contactor at a first outlet of the first contactor, the first contactor draining at least a portion of the liquid in the contactor, the drained liquid exiting the first contactor at the second outlet of the first contactor. The system also includes a second contactor including at least one inlet and at least one outlet, wherein the second contactor is in fluid communication with the first contactor at a first inlet of the second contactor and a first outlet of the second contactor, the first inlet of the second contactor receiving the liquid from the first outlet of the first contactor, the second contactor purging a second portion of gas from the liquid, the first outlet of the second contactor releasing the liquid having the second portion of gas purged to the first contactor via a third inlet of the first contactor that is in fluid communication with the first outlet of the second contactor, and wherein the first contactor includes a fourth inlet in fluid communication with the first liquid source, the fourth inlet of the first contactor allowing the first liquid source to release liquid at an ambient pressure.

In another aspect, the invention provides a method for recirculating ozonated liquid. The method involves supplying a liquid and a gas to a contactor; purging, with the gas, at least a portion of gas from the liquid; and draining a portion of the liquid from the contactor.

In some embodiments, the liquid is supplied to the contactor at an ambient pressure.

In some embodiments, the method involves supplying at least a portion of the liquid drained from the contactor back to the contactor.

In some embodiments, the method involves replacing at least a portion of liquid drained from the contactor with a fresh liquid.

In some embodiments, the method involves pressurizing the liquid drained from the contactor via a first pump.

In some embodiments, the method involves removing at least a portion of gas from the first pump via a second pump.

In some embodiments, the method involves heating or diluting the purged gas with CDA or other inert gas.

In some embodiments, the method involves converting the purged gas into $O_2$. In some embodiments, the method involves outputting the converted gas. In some embodiments, the method involves measuring a gas flow of the output gas and using the information for system control.

In some embodiments, the method involves measuring and/or controlling a temperature of the liquid via a heat exchanger or by liquid discarding.

In some embodiments, the liquid supplied to the contactor comprises ozonated deionized water ($DIO_3$).

In some embodiments, the gas is (i) $O_3$, (ii) $O_2$, (iii) $CO_2$, (iv) $N_2$, (iv) Clean Dry Air (CDA), (v) inert gas, (vi) doping gas, (vii) off-gas, (viii) off-gas from the second liquid source, or any combination thereof.

In some embodiments, the portion of gas purged from the liquid comprises (i) $O_3$, (ii) $O_2$ (iii) $CO_2$, or any combination thereof.

In some embodiments, the liquid is supplied to the contactor from a tool used in a semiconductor manufacturing process.

BRIEF DESCRIPTION OF THE DRAWINGS

The advantages of the invention described above, together with further advantages, may be better understood by referring to the following description taken in conjunction with the accompanying drawings. The drawings are not necessarily to scale; emphasis instead is generally placed upon illustrating the principles of the invention.

DETAILED DESCRIPTION OF THE INVENTION

System Overview

In general, the invention includes systems and methods for reclaiming and reusing liquid expelled from a tool (e.g., a semiconductor process manufacturing tool). For example, an ozonated deionized water ($DIO_3$) fluid delivery system can provide $DIO_3$ to a semiconductor manufacturing processing tool. The semiconductor manufacturing tool expels a portion of the $DIO_3$ (e.g., an unused portion), and the $DIO_3$ is recaptured by a reclaim system.

Generally, the reclaim system recaptures and recirculates the expelled liquid with a buffer contactor and a pump (e.g., a centrifugal pump). Since the liquid can be pressure-less (e.g., at an ambient pressure), gas bubbles can be avoided at any inlets of the fluid delivery system, as well as in the pump. The reclaim system can use the contactor to purge a portion of unwanted gas from the liquid before the pump recirculates the liquid back to the fluid delivery system.

Figure 1A:
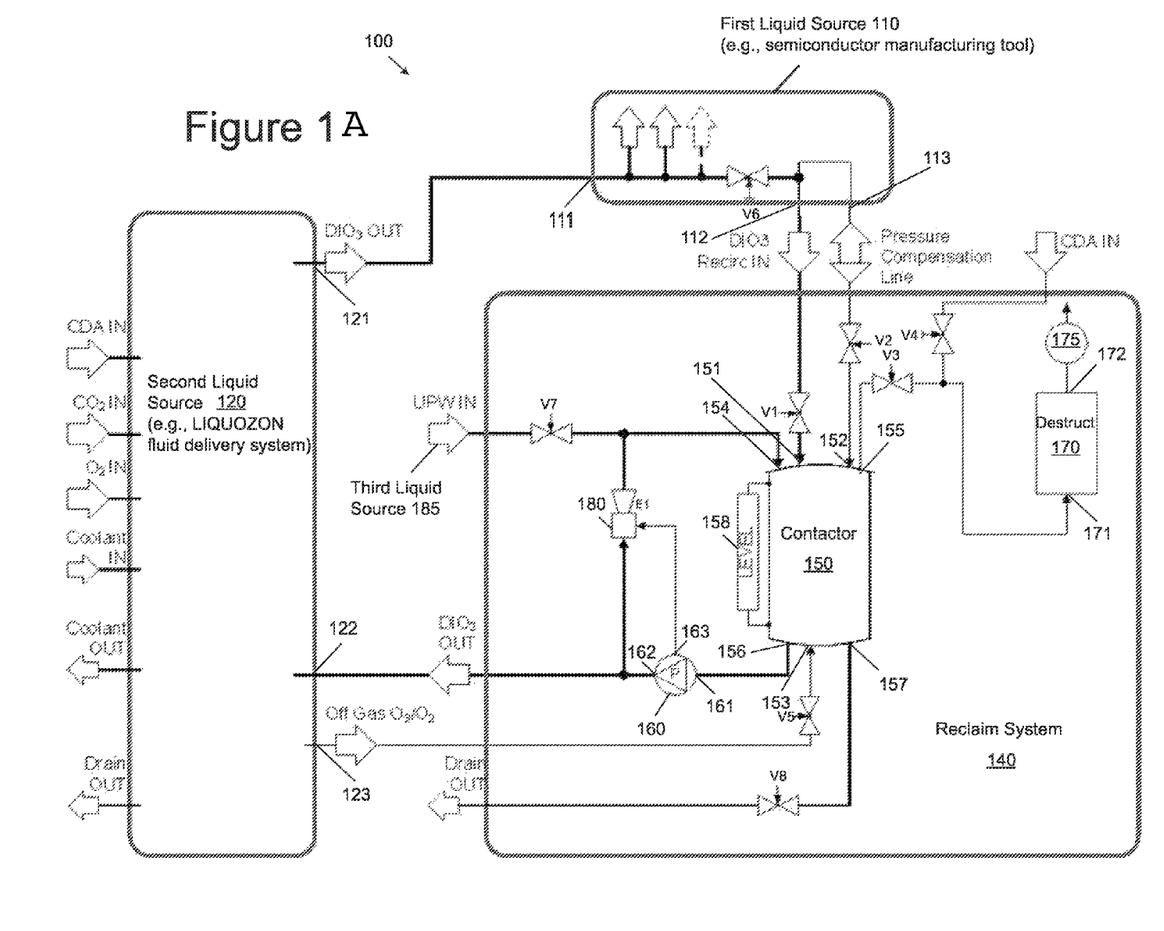
FIG. 1A is a diagram of a system for recirculating and reclaiming liquid (e.g., ozonated deionized water), according to an illustrative embodiment of the invention.

FIG. 1A depicts a system 100 that recirculates and reclaims pressure-less liquid (e.g., ozonated deionized water at an ambient pressure) according to an illustrative embodiment of the invention. By way of overview, such a system can be useful, for example, in semiconductor manufacturing processes that employ tools with pressure-less liquid outlets. Current systems typically waste liquid because they either drain out any excess liquid, or are unable to properly recirculate pressure-less liquids. A system capable of reclaiming and recirculating pressure-less liquid is advantageous from both financial and environmental standpoints.

The system 100 includes a first liquid source (e.g., "tool") 110, a second liquid source (e.g., "fluid delivery system") 120, and a reclaim system 140.

Tool

In the illustrated embodiment, the tool 110 performs one or more semiconductor manufacturing processes (e.g., etching or cleaning of semiconductor wafers). In some embodiments, the tool 110 can perform other types of processes related to semiconductor manufacturing or otherwise. The tool 110 includes a liquid inlet 111 that is in fluid communication with the delivery system 120, and liquid outlets 112, 113 that are in fluid communication with the reclaim system 140. In some embodiments, the tool 110 includes multiple tools. In some embodiments, the tool 110 includes any number of inlets and/or outlets.

Fluid Delivery System

The illustrated fluid delivery system 120 can generate and deliver fluids (i.e., liquids and/or gasses) to the tool 110 and the reclaim system 140. The fluid delivery system 120 can receive reclaimed liquid from the system 140, as discussed further below. In some embodiments, the fluid delivery system 120 comprises a LIQUOZON system.

In the illustrated embodiment, the fluid delivery system 120 includes (i) a liquid outlet 121 in fluid communication with the tool 110, (ii) a liquid inlet 122 in fluid communication with the reclaim system 140, and (iii) a gas outlet 123 in fluid communication with the reclaim system 140. Those skilled in the art appreciate that other embodiments can include a greater or lesser number of such inlets and/or outlets.

In various embodiments, the liquid is ozonated deionized water ($DIO_3$), deionized water (DI-water), ultrapure water (UPW), Hydrogen-Flouride (HF), acids, bases, solvents, or any combination thereof. In various embodiments, the gas is Oxygen ($O_2$), Carbon Dioxide ($CO_2$), Ozone ($O_3$), ($N_2$), Clean Dry Air (CDA), off-gas (e.g., from the fluid delivery system 110) or any combination thereof. Those skilled in the art appreciate that these are but a few examples of liquids and gasses that can be generated and delivered by the fluid delivery system 120, and other embodiments can include other gasses and/or liquids instead of, or in addition to, those discussed here.

Reclaim System

Generally, the reclaim system 140 reclaims liquid drained from the tool 110 for recirculation to the fluid delivery system 120 and the tool 110. In the illustrated embodiment, the reclaim system 140 includes a buffer contactor (or, "contactor") 150, a first pump 160, a destruct component 170, a second pump 180, a third liquid source (or, "fresh liquid source") 185, and associated valves V1-V8 and sensors 158, 175. In some embodiments, the liquid is pressure-less.

Buffer Contactor

The illustrated contactor 150 facilitates recirculation and reclaiming of pressure-less liquid (e.g., liquid at an ambient pressure) output by the tool 110. More specifically, the contactor 150 (i) purges harmful or unwanted gas from the liquid before it recirculates back to the fluid delivery system 120 and tool 110, and (ii) can allow the system 100 to handle varying recirculation flows. The varying recirculation flows can be handled by means of liquid buffering. The contactor (buffer) fresh water can be enriched with wanted gases, in order to, for example, allow for stable concentration control in the second liquid source 120. In the illustrated embodiment, the contactor 150 can be a column, multiple columns, or other suitable shape. For example, the contactor 150 can be one or more packed columns, plate columns, and/or bubble columns.

In the illustrated embodiment, the contactor 150 includes (i) inlets 151-154, and (ii) outlets 155-157. Some embodiments can use a greater or lesser number of inlets and/or outlets. The contactor 150 is in fluid communication with the tool 110 via contactor inlets 151, 152. More specifically, the inlets 151, 152 receive liquid (e.g., $DIO_3$) released by the tool 110 at outlets 112, 113, respectively. The liquid can be at an ambient pressure (i.e., pressure-less). The pressure-less output of the tool 110 can be maintained by splitting the liquid flow to the contactor 150 between two inlets 151, 152. This prevents, for example, sucking at a tool 110 outlet that could cause a negative pressure that would interrupt liquid flow from the tool 110. The two outlets 112 and 113 of the first liquid source 110 can be connected to the two inlets 151 and 152 of the contactor 150 drain lines. The drain line between the tool outlet 112 and the contactor inlet 151 can be approximately 15 mm. The drain line between the tool outlet 113 and the contactor inlet 152 can approximately be 6.55 mm. Drain lines on this order can be less expensive then, for example, drain lines with a diameter of 40 mm.

In the illustrated embodiment, the contactor 150 is in fluid communication with the delivery system 120 via contactor inlet 153. The contactor 150 can be supplied with a gas, or mixture of gases, from outlet 123 of the fluid delivery system 120. The gas supplied by the fluid delivery system 120 can be used to purge a portion of gas, such as Ozone, from liquid in the contactor 150. The supplied gases can include, for example, (i) $O_3$, (ii) $O_2$, (iii) $CO_2$, (iv) $N_2$, (iv) Clean Dry Air (CDA), (v) inert gas, (vi) doping gas, (vii) off-gas, (viii) off-gas from the fluid delivery system 120, or any combination thereof.

The contactor 150 is in fluid communication with the fresh liquid source 185 via inlet 154. In the illustrated embodiment, the fresh liquid source 185 supplies the contactor 150 with a fresh liquid, e.g., ultrapure water (UPW). The UPW can replace liquid drained from the contactor 150, e.g., for recirculation via outlet 156 or disposal via outlet 157. In some embodiments, the fresh liquid source 185 can be a part of the fluid deliver system 120.

The liquid flow from the fresh liquid source 185 can be based upon the level sensor 158 which can monitor and/or control fluid levels in the contactor 150. The level sensor 158 ensures, for example, that liquid levels in the contactor 150 remain within a desired level (e.g., not too low or too high).

The contactor 150 is in fluid communication with the destruct component 170 via contactor outlet 155. As discussed above and below, harmful or unwanted gases (e.g., $O_3$) can be purged from liquid in the contactor 150 before the liquid is recirculated. In the illustrated embodiment, the purged gas (e.g., $O_3$) is exhausted from contactor outlet 155 to an inlet 171 of the destruct component 170.

Destruct Component

The illustrated destruct component 170 converts at least a portion of gas exhausted from the contactor 150 (e.g., Ozone) into a second gas (e.g., Oxygen). The destruct component 170 can convert the harmful or unwanted gas exhausted from the contactor 150 into a gas that can be safely released into the surrounding the environment, e.g., via outlet 172. In the illustrated embodiment, destruct component 170 uses one or more catalysts (e.g., manganese-oxide (e.g., carulite 200®) with some additional carbon-based product) to efficiently convert the purged gas (e.g., Ozone) into the second gas (e.g., Oxygen).

Centrifugal Pump

The illustrated first pump 160 draws liquid from the contactor 150 via outlet 156 for recirculation, and can pressurize the liquid, e.g., for use by the tool 110. The pump 160 can additionally pump a portion of the liquid to the fluid delivery system 120, the second pump 180, and/or back to the contactor 150. In the illustrated embodiment, first pump 160 is a centrifugal pump, although in other embodiments it may be another type of pump (e.g., membrane pump, etc.). The pump 160 is in fluid communication with (i) the contactor 150 via pump inlet 161 and pump outlet 162, (ii) the fluid delivery system 110 via pump outlet 162, and, optionally, (iii) the second pump 180 via pump outlets 162, 163.

Liquid Jet Pump

The illustrated second pump 180 operates with a small amount of pressurized $DIO_3$ to remove gas (e.g., $CO_2$) from the first pump 160, e.g., to avoid gas enrichment in the pump 160. Alternatively, the second pump 180 can be operated with CDA instead of DIO$_3$. In the illustrated embodiment, the second pump 180 is a liquid jet pump. Some embodiments can use another type of pump, or forgo the second pump altogether.

Heat Exchanger

Generally, liquid temperature in the pump 160 increases as the pump 160 cycles. In order to maintain proper operation of the reclaim system 140, and the system 100 overall, the liquid can remain within a certain temperature window (e.g., 20 to 24° C.). In some embodiments, a heat exchanger is used to maintain the liquid temperature (e.g., within the desired temperature window). The heat exchanger can be in parallel with the second pump 180. In other embodiments, the liquid temperature is maintained by draining a portion of hot liquid from the pump 160.

Valves

In the illustrated embodiment, valves V1-V8 control the flow of gas and liquid between components of the system 100, or within the components themselves. For example, valves V1-V8 can include any of two-way valves, check valves, pilot valves, flow restrictors, variable valves, controlled values, any valve known to those skilled in the art, and/or any combination thereof. Although valves V1-V8 are shown here, those skilled in the art appreciate that some embodiments can use a lesser or greater number of such valves.

Sensors

The system 140 can include a plurality of sensors, such as level sensor 158 and gas flow meter 175. The sensor 158 can be used to monitor and/or control the liquid and/or gas levels in the contactor 150. The illustrated gas flow meter 175 monitors the flow rate of the gas exhausted by the destruct component 170 via outlet 172. This information can be used for system control. For example, the gas flow meter 175 can react fast to volume changes of the contactor liquid content than the level sensor 158 can detect it. Level changes can be delayed due to, for example, slow trickling of the liquid through the contactor 150. The information from the gas flow meter 175 can allow a better dynamic system control and system stability to, for example, ensure an adequate liquid supply for the second liquid source 120. The level sensor 158 can provide an indication of the steady state level.

Additional sensors (not shown) can be used to monitor and/or control parameters such as flow rate or pressure of the gases and liquids in other parts of the system 140.

Second Contactor

Figure 1B:
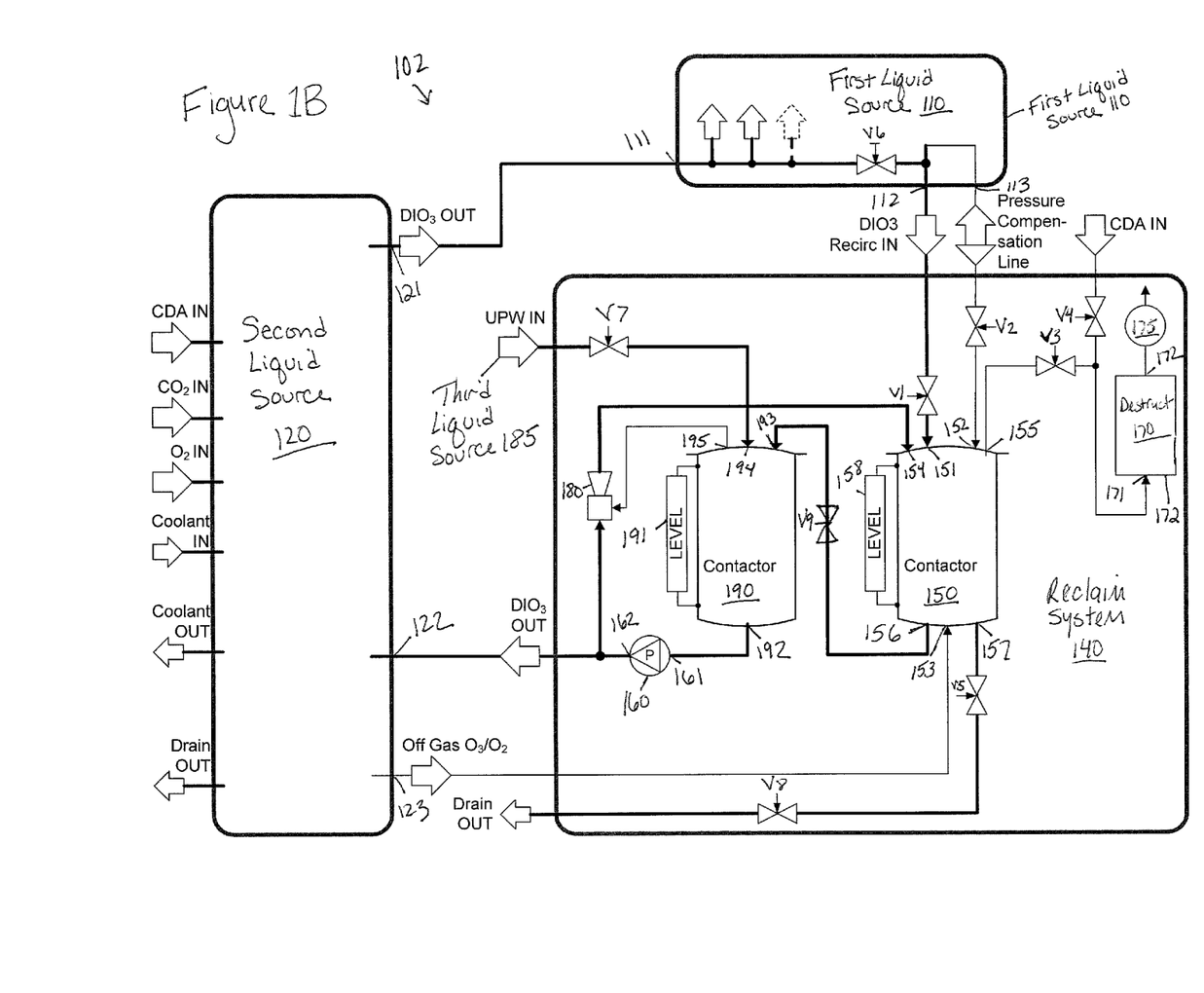
FIG. 1B is a diagram of a system for recirculating and reclaiming liquid (e.g., ozonated deionized water), according to an illustrative embodiment of the invention.

In some embodiments, a second contactor is used to further purge unwanted gas from the liquid. FIG. 1A is a diagram 102 of a system for recirculating and reclaiming liquid (e.g., ozonated deionized water), according to an illustrative embodiment of the invention. A second contactor 190 is in fluid communication with the first contactor 150, the pump 160, the pump 180, the third liquid source 185, the second liquid source 122 and a level 191.

The second contactor 190 receives the liquid output from the first contactor 150 via outlet 156 at a first inlet 193 of the second contactor 190, the liquid having a first portion of unwanted gas purged by the first contactor 150. The pump 180 and the valve V9 can act as a vacuum to allow the liquid from the first contactor 150 to flow to the second contactor 190.

The second contactor 190 receives liquid (e.g., ultrapure water) from the third liquid source 185 at a second contactor inlet 194. The second contactor 190 purges a second portion of unwanted gas from the liquid. The second contactor 190 has liquid drawn out from outlet 192 by pump 160. A first portion of the liquid exiting the second contactor 190 flows into the second liquid source 120 via inlet 122. A second portion of the liquid exiting the second contactor 190 flows back into the contactor 150 via inlet 154.

The second contactor 190 is in communication with level 191. The level 191 can detect the fluid level within the second contactor 190.

Figure 2A:
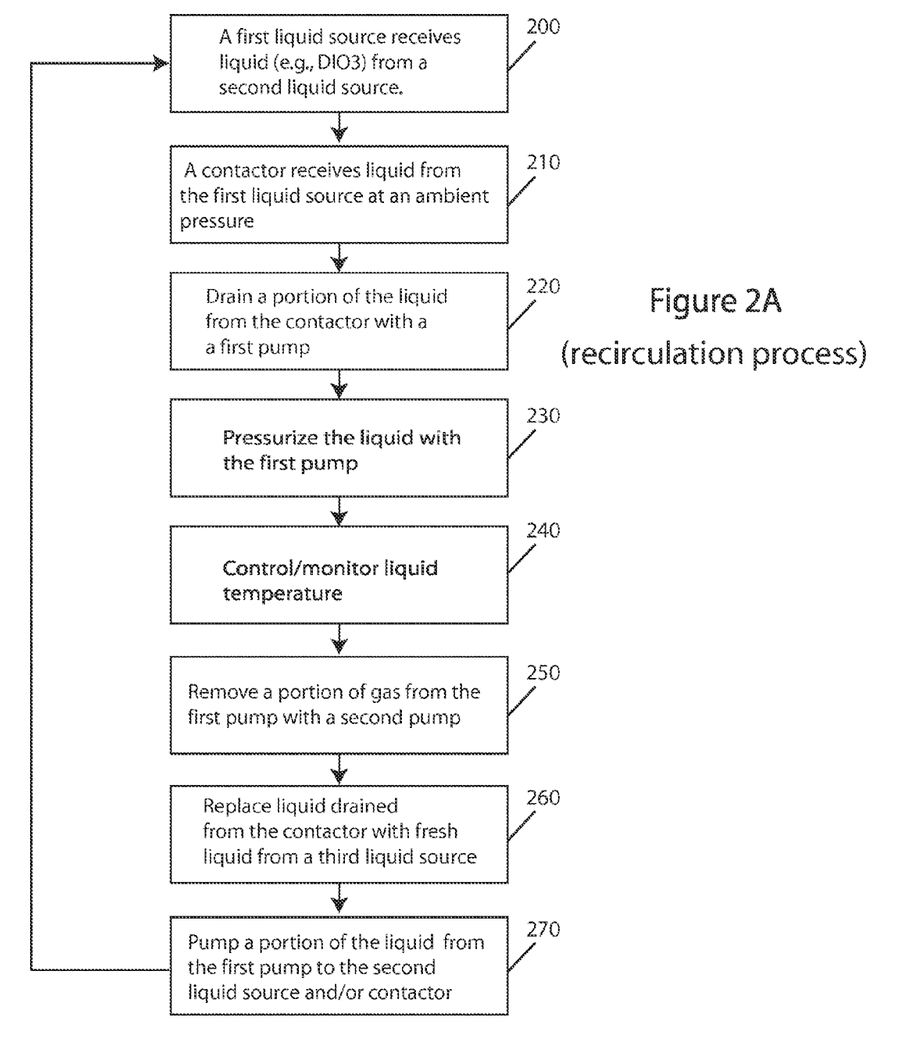
FIG. 2A is a flow chart illustrating a method for recirculating liquid, according to an illustrative embodiment of the invention.
Figure 2B:
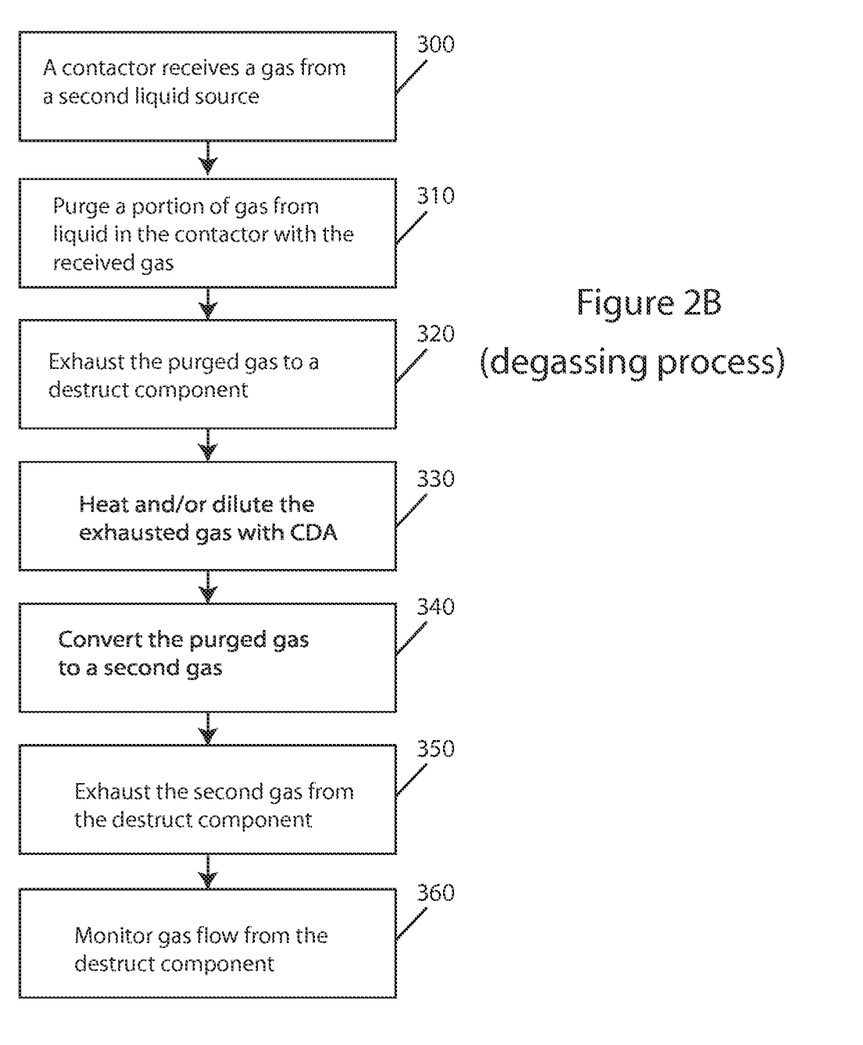
FIG. 2B is a flow chart illustrating a method for degassing liquid, according to an illustrative embodiment of the invention.

FIGS. 2A and 2B are flow charts showing exemplary methods for recirculating and reclaiming liquid, according to illustrative embodiments of the invention. For illustrative purposes, the recirculation and degassing are shown in two separate flow charts, FIG. 2A and FIG. 2B, respectively. Although the steps are discussed in a particular order, those skilled in the art appreciate that the steps can be performed in a different order, or simultaneously with other steps, with respect to one or both Figures.

Recirculation Method

FIG. 2A, more particularly, is a flow chart illustrating an exemplary recirculation method according to an illustrative embodiment of the invention.

In step 200, a liquid (e.g., DIO$_3$) is supplied to a first liquid source (e.g., tool 110, as described above in FIG. 1A) from a second liquid source (e.g., fluid delivery system 120, as described above in FIG. 1A). For example, referring to FIG. 1A, the liquid can be supplied to a tool inlet 111 via the fluid delivery system outlet 121.

In step 210, a contactor (e.g., contactor 150, as described, above in FIG. 1A) receives liquid at an ambient pressure from the first liquid source (e.g., at contactor inlets 151, 152, as described above in FIG. 1A). Ambient pressure can be maintained by, for example, allowing gas flowing out of the contactor inlet 152 to the liquid outlet 112 via outlet 113 from the first liquid source 110. This configuration, for example, maintains a consistent flow control within the first liquid source and prevents negative pressure buildup at any of its outlets.

In step 220, the contactor drains a portion of the liquid received from the first liquid source. More specifically, a first pump (e.g., a centrifugal pump 160, as described above in FIG. 1A) pumps the liquid from contactor (e.g., via contactor outlet 156, as described above in FIG. 1A). The drained liquid can be pressurized by the first pump, as shown in step 230.

As liquid in the first pump is cycling, the liquid absorbs the electrical energy used to operate the first pump, thereby increasing a temperature of the liquid. In order to maintain continued recirculation, the liquid temperature is monitored and controlled, as shown in step 240. In some embodiments, a heat exchanger (e.g., heat exchanger, as described above in FIG. 1A) is used to ensure that the liquid stays within permissible operating temperatures (e.g., 20 to 24° C.). In addition to, or instead of using a heat exchanger, a portion of hot liquid can be drained from the first pump in order to maintain the proper temperature window.

In order to ensure that gas buildup in the first pump does not interfere with its operation, gas can be removed from the first pump with an optional second pump (e.g., liquid jet pump 180, as described above in FIG. 1A), as shown in step 250.

In step 260, liquid drained from the contactor is replaced with a fresh liquid (e.g., UPW) from a third liquid source (e.g., third liquid source 185, as described above in FIG. 1A). Since fresh liquid may not contain the necessary gas (e.g., Ozone), off-gas from the fluid delivery system can be supplied to the contactor in order to maintain a constant, or substantially constant, gas (e.g., Ozone) concentration therein.

Liquid levels within the contactor are monitored via a sensor (e.g., level sensor 158, as described above in FIG. 1A), and flow rate from the third liquid source is controlled to ensure an optimal liquid level within the contactor. There can be a linear flow rate of fresh liquid from the third liquid source to the contactor.

In step 270, the first pump pumps a portion of the liquid to the fluid delivery system 120 (e.g., at inlet 122, as described above in FIG. 1A), and a portion of the liquid back to the contactor. In some embodiments, liquid pumped back to the contactor is mixed with fresh liquid from the third liquid source before the fresh liquid is received by the contactor (e.g., via inlet 154, as described above in FIG. 1A). Mixing a portion of liquid from the first pump with the fresh liquid can ensure, for example, that liquid in the contactor maintains appropriate gas (e.g., Ozone) levels, since the fresh liquid may not contain the required gas.

Degassing Method

FIG. 2B, more particularly, is a flow chart illustrating an exemplary degassing method according to one embodiment of the invention.

In step 300, a contactor (e.g., contactor 150, as described above in FIG. 1A) receives one or more gasses at a contactor inlet from a second liquid source (e.g., fluid delivery system 120, as described above in FIG. 1A). For example, referring to FIG. 1A, gas can be supplied to contactor inlet 153 from fluid delivery system outlet 123. The one or more gasses can be (i) $O_3$, (ii) $O_2$, (iii) $CO_2$, (iv) $N_2$, (iv) Clean Dry Air (CDA), (v) inert gas, (vi) doping gas, (vii) off-gas, (viii) off-gas from the second liquid source, or any combination thereof.

In step 310, the received gas purges a portion of harmful or unwanted gas (e.g., Ozone) from liquid in the contactor. For example, the gas can be purged due to the differential partial pressure of the unwanted or harmful gas in the liquid. The purged gas is exhausted from the contactor to a destruct component (e.g., destruct component 170, as described above in FIG. 1A), as shown in step 320. For example, referring to the FIG. 1A, the purged gas can be exhausted from contactor outlet 155 to destruct component inlet 171. Optionally, the purged gas can be heated and/or diluted with CDA or other inert gas, e.g., to reduce the dew point of the gas, thereby preventing or reducing condensation inside the destruct component 170, as shown in step 330.

In step 340, the destruct component converts the purged gas (e.g., Ozone) into a second gas (e.g., Oxygen). As described above in FIG. 1A, destruct component can use one or more catalysts (e.g., manganese-oxide with some additional carbon-based product) to convert the purged gas into the second gas. The second gas is then released, or exhausted, via an outlet of the destruct component, into the surrounding environment in a safe manner, as shown in step 350. For example, referring to FIG. 1A, the second gas can be exhausted via destruct component outlet 172.

In step 360, a gas flow at the outlet of the destruct component is measured. The measurements can be used to system control. For example, referring to FIG. 1A, the gas flow meter 175 can measure the gas flow at outlet 172 of the destruct component.

Variations, modifications, and other implementations of what is described herein will occur to those of ordinary skill in the art without departing from the spirit and the scope of the invention. Accordingly, the invention is not to be limited only to the preceding illustrative descriptions.

What is claimed is:

1. A system for recirculating ozonated liquid, comprising:
a contactor including at least two inlets and at least two outlets, the contactor being in fluid communication with a first liquid source at a first contactor inlet and a second liquid source at a second contactor inlet, the second contactor inlet receiving gas that purges at least a portion of gas from liquid received at the first contactor inlet, the purged gas exiting the contactor at a first contactor outlet, wherein the contactor is in fluid communication with the second liquid source at a second contactor outlet, the contactor draining at least a portion of the liquid in the contactor, the drained liquid exiting the contactor at the second contactor outlet, and wherein the contactor includes a third inlet in fluid communication with the first liquid source, the third inlet allowing the first liquid source to release liquid at an ambient pressure.

2. The system of claim 1, wherein at least a portion of the liquid received at the first contactor inlet comprises at least a portion of the liquid drained from the contactor via the second contactor outlet.

3. The system of claim 1, wherein the contactor includes a fourth inlet in fluid communication with a third a liquid source, the fourth inlet receiving fresh liquid from the third liquid source that replaces at least a portion of the liquid drained from the contactor.

4. The system of claim 1, wherein the contactor comprises any of a packed column, plate column, or bubble column.

5. The system of claim 1, further comprising a first pump in fluid communication with the contactor via a) at least one inlet of the first pump being in fluid communication with the second outlet of the contactor, and b) an outlet of the first pump being in fluid communication with the second liquid source.

6. The system of claim 5, wherein the outlet of the first pump is in fluid communication with the contactor via a fourth inlet of the contactor.

7. The system of claim 5, where in the first pump comprises a centrifugal pump.

8. The system of claim 1, further comprising a destruct component that includes at least an inlet, the inlet of the destruct component in fluid communication with the first contactor outlet.

9. The system of claim 8, wherein the inlet of the destruct component receives at least a portion of the gas purged by the contactor.

10. The system of claim 9, wherein the gas received at the first inlet of the destruct component is heated or diluted with CDA or other inert gas.

11. The system of claim 9, wherein an outlet of the destruct component exhausts at least a portion of the purged gas received at the inlet of the destruct component.

12. The system of claim 10, wherein a gas flow at the outlet of the destruct component is measured and the information is used for system control.

13. The system of claim 11, wherein the destruct component uses a catalyst to convert the received gas into oxygen and exhausts the oxygen via the outlet of the destruct component.

14. The system of claim 13, wherein the catalyst comprises any of (i) manganese-oxide based product or (ii) a carbon-based product.

15. The system of claim 1, wherein any of the liquid (i) received at the first inlet of the contactor or (ii) drained from the second outlet of the contactor, comprises ozonated deionized water ($DIO_3$).

16. The system of claim 1, wherein the gas received at the first inlet of the contactor comprises (i) $O_3$, (ii) $O_2$, (iii) $CO_2$, (iv) $N_2$, (iv) Clean Dry Air (CDA), (v) inert gas, (vi) doping gas, (vii) off-gas, (viii) off-gas from the second liquid source, or any combination thereof.

17. The system of claim 1, wherein the portion of gas purged from the liquid comprises (i) $O_3$, (ii) $O_2$ (iii) $CO_2$, or any combination thereof.

18. The system of claim 17, wherein the gas received at the first inlet of the contactor is the off-gas from the second liquid source.

19. The system of claim 1, wherein the first liquid source comprises a tool used in a semiconductor manufacturing process.

20. The system of claim 1, wherein a temperature of the liquid is measured and a temperature of the liquid is controlled via a heat exchanger or by liquid discarding.

21. The system of claim 1, wherein the second liquid source comprises a $DIO_3$ water delivery system.

22. The system of claim 5, further comprising a second pump being in fluid communication with any of (i) the first outlet of the first pump, or (ii) a second outlet of the first pump.

23. The system of claim 22, wherein the second pump comprises a jet pump.

* * * * *